United States Patent
Li et al.

(10) Patent No.: US 9,123,673 B2
(45) Date of Patent: Sep. 1, 2015

(54) WAFER BACK SIDE PROCESSING STRUCTURE AND APPARATUS

(71) Applicant: Taiwan Semiconductor Manufacturing Company, Ltd., Hsin-Chu (TW)

(72) Inventors: Cheng-Chien Li, Jhubei (TW); Wei-Chih Lin, Taipei (TW); Song-Bor Lee, Zhubei (TW); Ching-Kun Huang, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 8 days.

(21) Appl. No.: 13/924,993

(22) Filed: Jun. 24, 2013

(65) Prior Publication Data
US 2014/0273508 A1    Sep. 18, 2014

Related U.S. Application Data

(60) Provisional application No. 61/778,162, filed on Mar. 12, 2013.

(51) Int. Cl.
*H01L 21/02* (2006.01)
*H01L 21/324* (2006.01)

(52) U.S. Cl.
CPC ........ *H01L 21/324* (2013.01); *H01L 21/02304* (2013.01); *H01L 21/02362* (2013.01)

(58) Field of Classification Search
CPC ............... H01L 21/02225; H01L 21/02345; H01L 21/64; H01L 21/71
See application file for complete search history.

(56) References Cited

U.S. PATENT DOCUMENTS

2008/0315207 A1 *   12/2008   Yang et al. ............... 257/66

* cited by examiner

*Primary Examiner* — Cheung Lee
(74) *Attorney, Agent, or Firm* — Slater & Matsil, L.L.P.

(57) ABSTRACT

Disclosed herein is a method of processing a device, comprising providing a substrate having a buffer layer disposed on a back side and forming an outer protection layer over the back side of the buffer layer, forming a thermal layer on the back side of the outer protection layer and heating the substrate through the thermal layer and the back side of the outer protective layer. A back side protection layer may be formed on the back side of the buffer layer. The thermal layer has a thermal emissivity coefficient of about 0.7 or greater and a thickness greater than a roughness of the back side of the outer protection layer. The back side protection layer is an oxide with a thickness between about 20 angstroms and about 50 angstroms. The outer protection layer is a nitride with a thickness between about 50 angstroms and about 300 angstroms.

20 Claims, 4 Drawing Sheets

WAFER BACK SIDE PROCESSING STRUCTURE AND APPARATUS

The present application claims priority to U.S. Provisional Patent Application Ser. No. 61/778,162, entitled "Wafer Back Side Processing Structure and Apparatus," filed on Mar. 12, 2013, which application is hereby incorporated by reference herein.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductor layers of material over a semiconductor substrate, and patterning the various material layers using lithography to form circuit components and elements thereon.

Processing semiconductor wafers may lead to defects in the crystalline lattice of the semiconductor wafer. In some instances, voids, grain boundaries, interstitial defects, oxide-induced stacking faults, and other defects may be introduced during the fabrication process by imperfect substrate formation, layer deposition, etching, handling, impurities, and the like. Such defects may lead to degraded device performance.

Annealing is a process where a substrate is heated to a temperature to remediate crystalline damage. In some cases, the annealing energizes the atoms making up the crystalline structure to make new bonds with adjoining atoms, breaking high-energy bonds to form new, lower energy bonds. The annealing process may also comprise slowly bringing the heated wafer to a lower temperature in a controlled manner to avoid heat shock and prevent formation of new, undesirable crystalline defects.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to illustrate the relevant aspects of the embodiments and are not necessarily drawn to scale.

DETAILED DESCRIPTION

Figure 1:
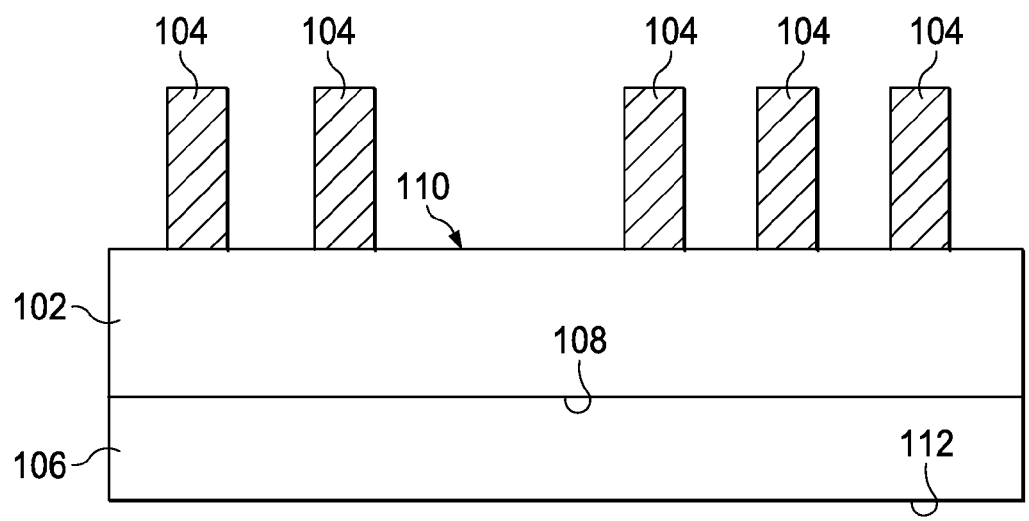
FIGS. 1-7 are cross-sectional views of intermediate process steps in back side wafer thermal processing according to various embodiments.

The making and using of the presented embodiments are discussed in detail below. It should be appreciated, however, that the present disclosure provides many applicable concepts that can be embodied in a wide variety of specific contexts. The specific embodiments discussed are merely illustrative of specific apparatuses and ways to make and use the described substrate layers in thermal wafer processing, and do not limit the scope of the disclosure.

Embodiments will be described with respect to a specific context, namely heat treating materials useful in, for example, semiconductor processing. Other embodiments may also be applied, however, to other coating procedures, including, but not limited to, coating treatment, discrete device manufacturing and processing, packaging coating and processing, or the like, or another heat treating procedure.

The embodiments of the present disclosure are described with reference to FIGS. 1 through 8, and variations of the embodiments are also discussed. Throughout the various views and illustrative embodiments of the present disclosure, like reference numbers are used to designate like elements. Additionally, the drawings are intended to be illustrative, are not to scale and not intended to be limiting. Note that, for simplification, not all element numbers are included in each subsequent drawing. Rather, the element numbers most pertinent to the description of each drawing are included in each of the drawings.

After one or more processing steps, a wafer may be annealed to correct for substrate damage created by the processing steps. Some processing procedures may create structures on the active surface of a wafer, and those structures may have various heights, materials and physical properties. For example, FinFET structures or transistor gates may be created on the substrate or source/drain implants formed in the substrate. It is believed that the various structures on the front side of a wafer may cause a heating "patterning effect" where the structures cause the body or bulk of the wafer to heat unevenly do to the heat absorption or blocking by the front side structures. It is further believed that heating a wafer from the back side may create a more even heating pattern for the body of the substrate and wafer.

It has been discovered that irregularities in the back side surface of the wafer may contribute an uneven heating pattern similar in effect to the patterning effect created by the front side structures. It has also been discovered that creating a uniform, substantially planar surface on the back side layers provides a more uniform heating pattern, reducing the patterning effect. It is believed that polishing the one or more back side protective layers or forming a thermal layer over the one or more back side protective layers provides a uniform surface leading to greater heating uniformity during annealing. Additionally, it is believed that a uniform back side surface for heating results in more efficient heat energy transmission to the substrate and reduced thermal budget.

Referring now to FIG. 1, a substrate 102 with a buffer layer 106 disposed on the back side according to an embodiment is shown. The substrate 102 may have one or more structures 104 disposed on the front side 110 thereof. A buffer layer 106 is optionally formed on the back side 108 of the substrate 102. The buffer layer 106 may have a material selected to provide advantageous bonding characteristic to subsequent protective layers, and may also be based on the material of the substrate. For example, where the substrate is silicon (Si), the buffer layer 106 may be a polysilicon layer. In an embodiment, the buffer layer 106 has a thickness between about 500 angstroms and about 1000 angstroms, and may, in an embodiment, be about 710 angstroms thick. The thickness of the buffer layer 106 may contribute to the adhesion of subsequent layers on the back side 112 of the buffer layer 106. In another embodiment, the buffer layer 106 may be omitted.

Figure 2:
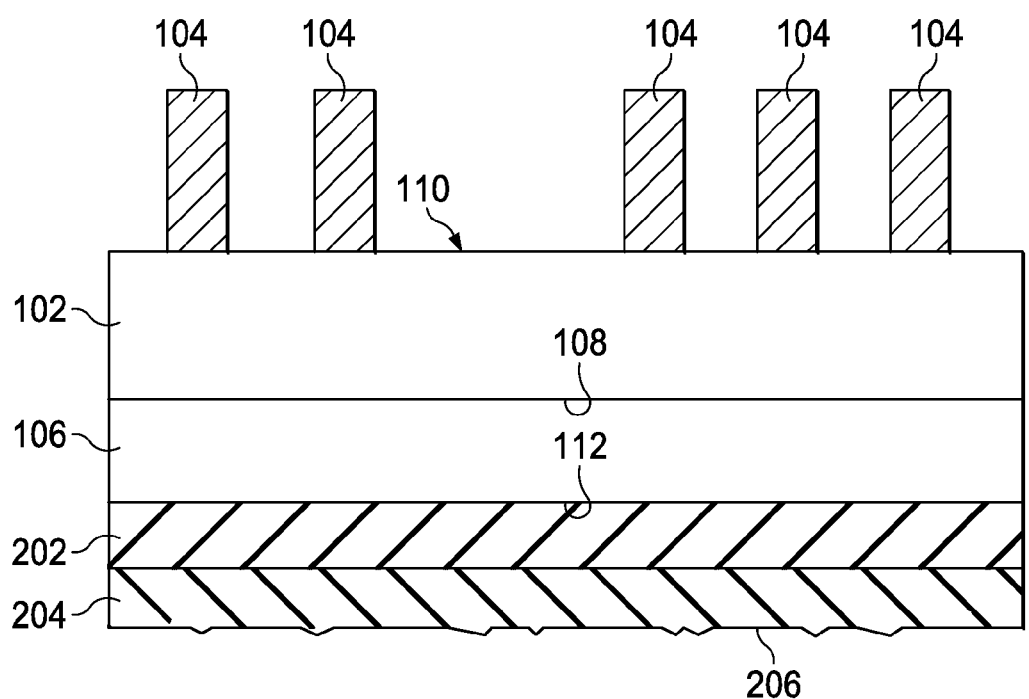

FIG. 2 is a cross-sectional view illustrating formation of a back side protective layer 202 and an outer protective layer 204 according to an embodiment. One or more layers may be formed on the buffer layer 106 to seal and protect the buffer layer 106 and substrate 102. In an embodiment, the back side protective layer 202 may be formed from one or more sub-layers. The back side protective layer 202 and outer protective layer 204 may have materials selected to bond to each other, and to the buffer layer 106. Additionally, the back side protective layer 202 and outer protective layer 204 may be formed from materials that seal or cap the substrate, preventing contaminants from the environment or subsequent processing steps from entering the substrate 102 through the back side 108.

The back side protective layer 202 may be an oxide, such as silicon dioxide ($SiO_2$) or the like. The back side protection layer 202 has a thickness sufficient to trap or block impurities from entering the buffer layer 106 and, in an embodiment, is between about 20 angstroms and about 50 angstroms. In an embodiment, the back side protection layer 202 is about 30 angstroms thick. The back side protective layer 202 is formed by, for example, thermal oxidation of the polysilicon buffer layer 106 or by chemical vapor deposition (CVP), epitaxy such as liquid or vapor phase epitaxy (LPE or VPE), atomic layer deposition (ALD) or the like.

The outer protective layer 204 is formed over the back side protective layer 202. In an embodiment, the outer protective layer 204 is a nitride, such as, for example, silicon nitride ($Si_xN_x$), silicon oxynitride (SiON), or the like. The outer protective layer 204 has a thickness sufficient to protect the back side protection layer 202 and buffer layer 106 and, in an embodiment, is between about 50 angstroms and about 300 angstroms. In an embodiment, the outer protective layer 204 is about 100 angstroms thick. The outer protective layer 204 and backside protection layer 202 may each have a high thermal emissivity. For example, a thermal emissivity of about 0.85 or greater is believed to result in greater heating uniformity.

Figure 3:
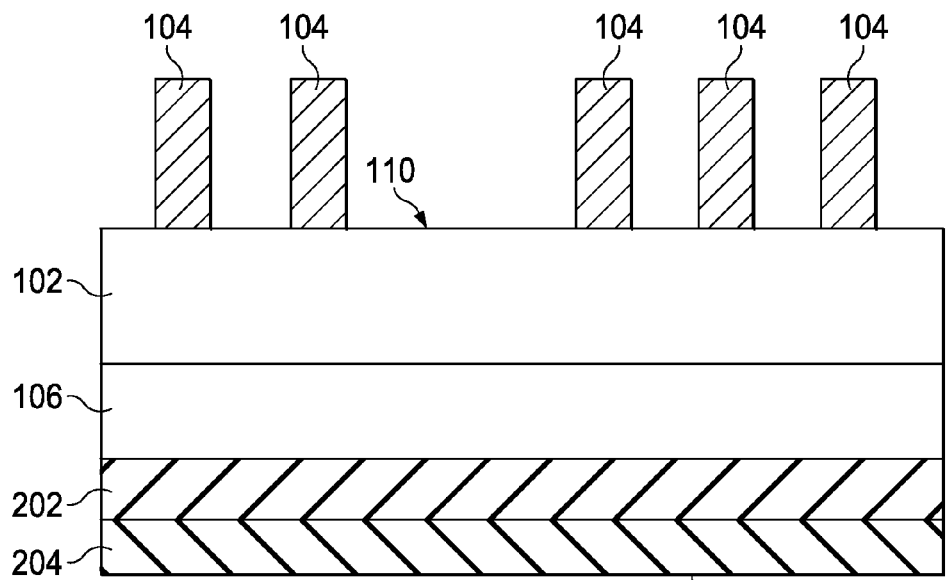

FIG. 3 is a cross-sectional view illustrating conditioning of the outer protective layer 204 according to an embodiment. The outer protective layer 204 is conditioned by polishing, for example, by a chemical-mechanical polish (CMP). The roughness of the outer protective layer back side 206 may be between about 20 angstroms and about 50 angstroms after formation. The CMP may, for example, thin the outer protective layer 204 to about 95 angstroms thick, and reduce the roughness of the back side 206 of the outer protective layer 204 so that the outer surface has an RMS roughness of about 200 angstroms or less. The desired maximum roughness may be determined by factors such as the wavelength of energy used to heat the substrate 102, the thermal budget of the substrate, tolerance to heat variation in the substrate, or the like. In an embodiment, the RMS of the outer surface roughness will be less than about 150 angstroms, or less than about 100 angstroms. The conditioning of the outer protective layer 204 may remove a portion of the protective layer, reducing the thickness of the outer protective layer 204. The outer protective layer may be formed with a thickness greater than the final thickness to account for the conditioning of the outer protective layer 204.

Figure 4:
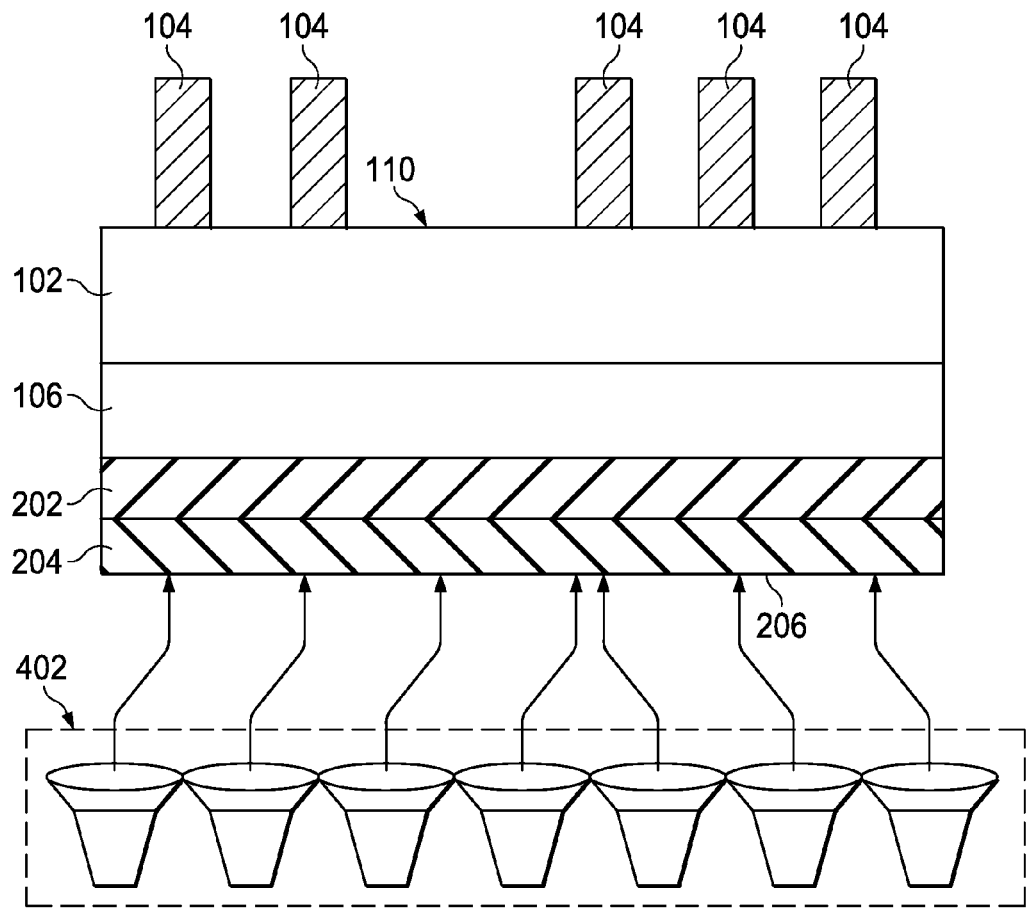

FIG. 4 is a cross sectional view illustrating annealing the substrate 102 according to an embodiment. An array of one or more heating elements 402 may be arranged to apply heat evenly to the back side 206 of the outer protective layer 204. For example, the heating elements 402 may provide an area or flat heat source with individual heating elements spread across the surface of the wafer to prevent uneven heating. The heating elements 402 may use, for example, infrared heating, visible light heating, resistive heating, or the like, to heat the substrate. In another example, the wafer may be annealed via rapid thermal annealing (RTA) or laser annealing. The wafer may be thermally annealed at a temperature of about 400° C. or greater, and may be high temperature annealed at a temperature of about 700° C. or greater.

It is believed that the thermal budget of the substrate 102 may be reduced since more evenly heating of the substrate 102 brings all regions of the substrate 102 up to the desired temperature at roughly the same time, instead of creating hot spots that exceed the desired predetermined temperature while the cooler, more slowly heated regions are heated. The heat may be maintained to bring the substrate to a predetermined temperature, and then reduced to control the cooling of the substrate 102. Subsequent processing steps may be performed after the annealing.

Figure 5:
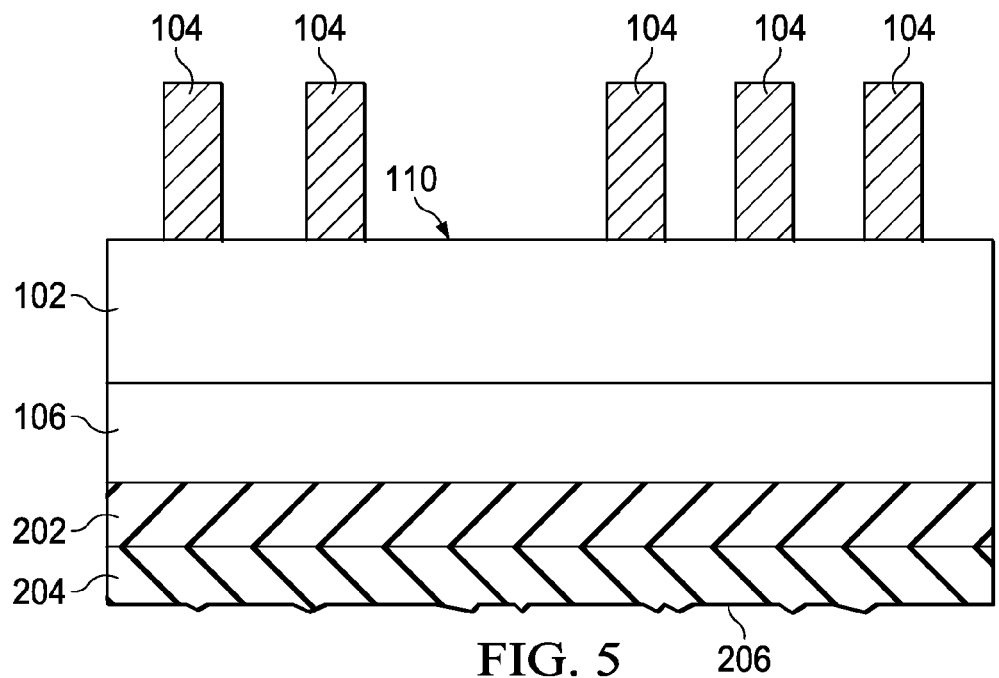
Figure 6:
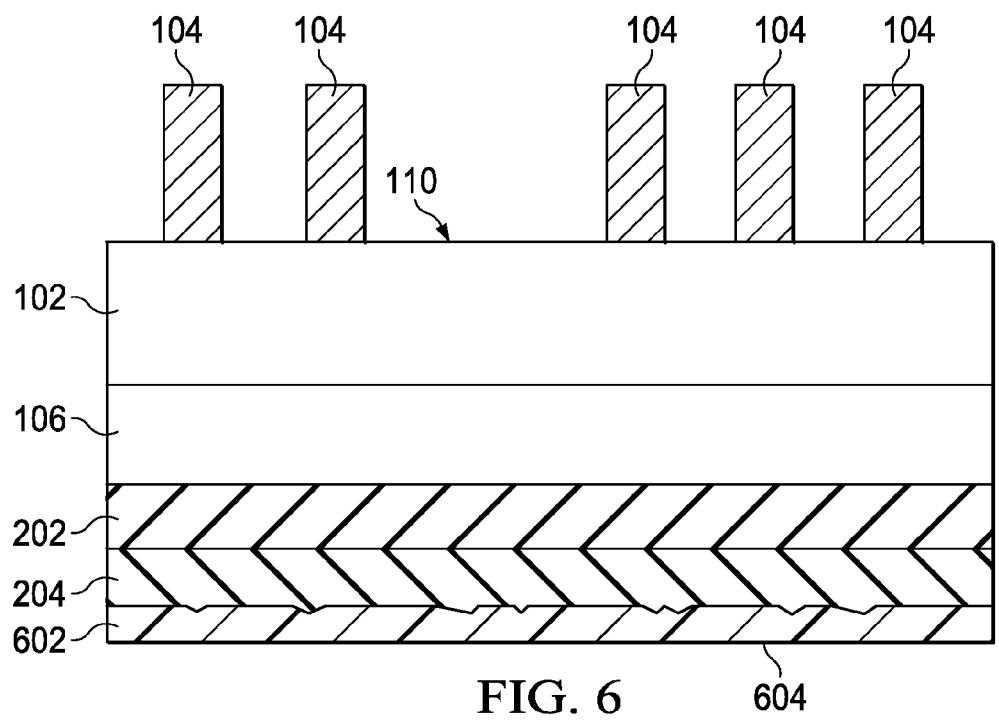
Figure 7:
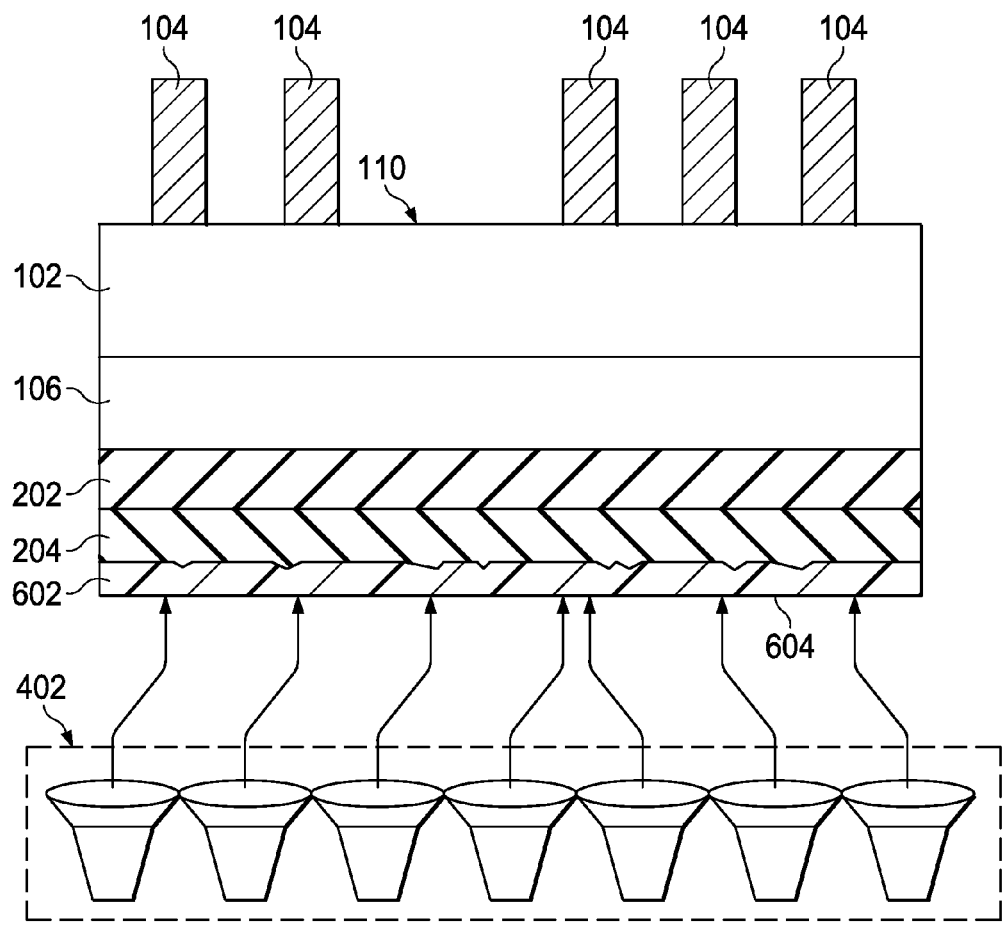

FIGS. 5-7 illustrate formation of a thermal layer (602, FIG. 6) and annealing of the substrate 102 according to another embodiment. Referring now to FIG. 5, a wafer having a substrate 102 with a buffer layer 106 may be provided or fabricated, and a back side protective layer 202 and outer protective layer 204 may be formed as described above with respect to FIGS. 1 and 2.

FIG. 6 is a cross-sectional view illustrating formation of a thermal layer 602 according to an embodiment. The thermal layer 602 is applied over the back side 206 of the outer protective layer 204. The thermal layer 602 is applied with a thickness at least great enough to account for the roughness of the back side of the outer protective layer 204. Thus, the thermal layer 602 may have a thickness greater than the roughness of the back side 206 of the outside protection layer 204. The thermal layer 602 fills in the variations in the back side 206 of the outer protective layer 204. The thermal layer 602 creates a smoother surface 604 than the back side 206 surface of the outer protection layer 204 as formed. The thermal layer 602 may have a high thermal emissivity and high thermal conductivity, such that the thermal layer 602 absorbs and re-radiates thermal energy to the outer protective layer 204. It has been discovered that the use of a high emissivity thermal layer 602 spreads and transmits heat through the thermal layer 602 and to the back side protection layer 202 more evenly than without. The thermal layer 602 compensates for the relatively uneven or rough surface of the back side 206 of the outer protection layer 204. The thermal layer 602 may have a thermal emissivity coefficient greater than about 0.85, and in an embodiment, has a thermal emissivity coefficient greater than 0.9.

The thermal layer 602 may be applied as a film layer, such as a liquid, as deposited thin film, or as a solid film. For example, the thermal layer 602 may be spun on as a liquid polymer or applied as a membrane-style film. The thermal layer 602 may for example, be a polyimide, a polymer or other material having a high percentage of elemental carbon (C), or the like. In another example, a metal or metal compound such as silicon carbide (SiC), sapphire ($Al_2O_3$) or an alumina ceramic may be sputtered or otherwise deposited on the back side 206 of the outer protection layer 204. Other examples of thermal layer materials may be carbon, cuprous oxide, oxidized cast iron, platinum, oxidized steel, asbestos, carborundum, limestone or calcium carbonate, ceramics, silicon oxynitride, or like materials or alloys.

FIG. 7 is a cross sectional view illustrating annealing the substrate 102 with the thermal layer 602 according to an embodiment. The substrate 102 may be heated through the thermal layer 602 with an array of heating elements 402 and using a method similar to that described above with respect to FIG. 4.

Figure 8:
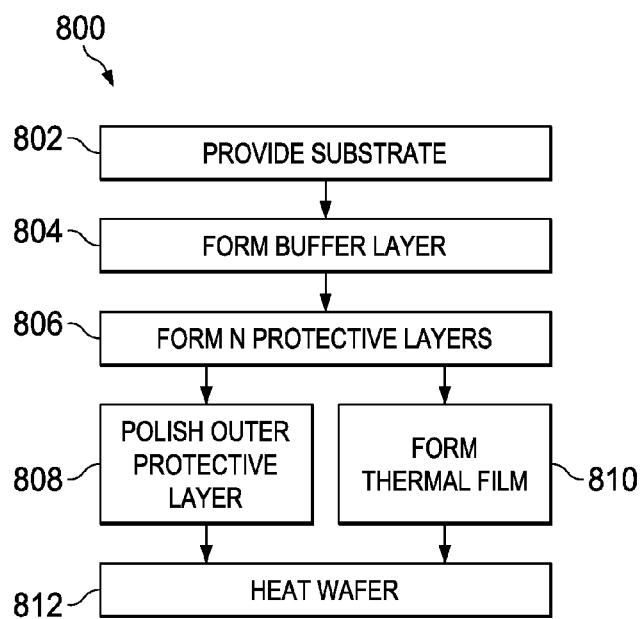
FIG. 8 is a flow diagram illustrating a method for backside wafer thermal processing according to an embodiment.

FIG. 8 is a flow diagram illustrating a method 800 of forming a conditioned coating and heating a substrate. A substrate is provided in block 802, and a buffer layer formed on the back side of the substrate in block 804. One or more protective layers are formed on the buffer layer in block 906, including the back side protective layer and outer protective layer. In an embodiment illustrated by block 808 the back side of the outer protective layer is polished. In an embodiment illustrated by block 810, a thermal layer is formed over the outer protective layer. The wafer, including the substrate, is heated to process one or more devices in block 812.

Thus, according to an embodiment, a method of forming a device comprises providing a substrate having a plurality of features on a front side, with the substrate having a buffer layer disposed on a back side and forming an outer protection layer over the back side of the buffer layer. The method further comprises polishing the back side of the outer protection layer and heating the substrate through the back side of the outer protective layer after the polishing the back side of the outer protection layer. The method further comprises forming a back side protection layer on the back side of the buffer layer prior to the forming the outer protection layer. The back side protection layer may be an oxide and the outer protection layer may be a nitride. The buffer layer may be polysilicon. Polishing the outer protection layer comprises reducing a roughness of the back side of the outer protection layer to have an RMS of about 20 angstroms or less.

According to another embodiment, a method of forming a device comprises providing a substrate having a plurality of features on a front side, the substrate having a buffer layer disposed on a back side and forming an outer protection layer over the back side of the buffer layer. In such an embodiment, the method further comprises forming a thermal layer on the back side of the outer protection layer and heating the substrate through the thermal layer and the back side of the outer protective layer after the forming the thermal layer. The method further comprises forming a back side protection layer on the back side of the buffer layer prior to forming the outer protection layer. The thermal layer has a thermal emissivity coefficient of about 0.7 or greater and a thickness greater than a roughness of the back side of the outer protection layer. The back side protection layer is an oxide and may be formed with a thickness between about 20 angstroms and about 50 angstroms. The outer protection layer is a nitride and may be formed with a thickness between about 50 angstroms and about 300 angstroms.

According to another embodiment, a method of forming a device comprises providing a substrate having a front side and a back side, forming a buffer layer on the back side of the substrate and forming a backside protection layer over the buffer layer. An outer protection layer is formed over the backside protection layer and a thermal layer is formed on the outer protection layer. The substrate is heated through the thermal layer. The buffer layer is polysilicon having a thickness between about 500 angstroms and about 1000 angstroms. The thermal layer has a thermal emissivity coefficient of about 0.7 or greater and a thickness greater than a roughness of the back side of the outer protection layer. The thermal layer may be formed in contact with the outer protection layer. The thermal layer is a polymer, polyimide, silicon carbide, sapphire or an alumina ceramic.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, and composition of matter, means, methods or steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a device, comprising:
providing a substrate having a front side and a back side, the substrate having a buffer layer disposed on the back side;
forming an outer protection layer over the buffer layer;
forming a thermal layer on the outer protection layer, the thermal layer having a first side in contact with the outer protection layer and a second side opposite the first side, a first roughness of the first side being greater than a second roughness of the second side; and
heating the substrate through the thermal layer and the outer protection layer.

2. The method of claim 1, further comprising forming a back side protection layer on the buffer layer prior to the forming the outer protection layer.

3. The method of claim 2, wherein the back side protection layer is an oxide.

4. The method of claim 3, wherein the back side protection layer is formed with a thickness between about 20 angstroms and about 50 angstroms.

5. The method of claim 1, wherein the thermal layer has a thermal emissivity coefficient of about 0.7 or greater.

6. The method of claim 5, wherein the thermal layer has a thickness greater than a roughness of the back side of the outer protection layer.

7. The method of claim 1, wherein the outer protection layer is a nitride.

8. The method of claim 7, wherein the outer protection layer is formed with a thickness between about 50 angstroms and about 300 angstroms.

9. A method of forming a device, comprising:
providing a substrate having a front side and a back side, the substrate having one or more active devices formed on the front side;
forming a buffer layer on the back side of the substrate;
forming a backside protection layer over the buffer layer;
forming an outer protection layer over the backside protection layer;
forming a thermal layer on the outer protection layer; and
heating the substrate through the thermal layer.

10. The method of claim 9, wherein the buffer layer is polysilicon having a thickness between about 500 angstroms and about 1000 angstroms.

11. The method of claim 9, wherein the thermal layer has a thermal emissivity coefficient of about 0.7 or greater and wherein the thermal layer has a thickness greater than a roughness of the back side of the outer protection layer.

12. The method of claim 9, the thermal layer is formed in contact with the outer protection layer.

13. The method of claim 9, wherein the thermal layer is a polymer or polyimide.

14. The method of claim 9, wherein the thermal layer is silicon carbide, sapphire or an alumina ceramic.

15. A method of forming a device, comprising:
providing a substrate having a first side and a second side opposite the first side;

forming a first protection layer over the second side of the substrate;

forming a second protection layer on the first protection layer, a first exposed side of the second protection layer having a first roughness;

forming a thermal layer on the first exposed side of the second protection layer, a second exposed side of the thermal layer having a second roughness, wherein the first roughness is greater than the second roughness; and annealing the substrate.

16. The method of claim 15, further comprising forming a buffer layer on the second side of the substrate.

17. The method of claim 15, wherein the thermal layer has a thermal emissivity coefficient of about 0.7 or greater.

18. The method of claim 15, wherein the thermal layer has a thickness greater than the first roughness of the first exposed side of the second protection layer.

19. The method of claim 15, wherein the annealing the substrate comprises heating the substrate through the thermal layer, the first protection layer and the second protection layer.

20. The method of claim 19, wherein the annealing is performed at a temperature of about 400° C. or greater.

* * * * *